(12) United States Patent
Minami et al.

(10) Patent No.: US 6,440,262 B1
(45) Date of Patent: Aug. 27, 2002

(54) RESIST MASK HAVING MEASUREMENT MARKS FOR MEASURING THE ACCURACY OF OVERLAY OF A PHOTOMASK DISPOSED ON SEMICONDUCTOR WAFER

(75) Inventors: Akiyuki Minami; Satoshi Machida, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/061,285

(22) Filed: Feb. 4, 2002

Related U.S. Application Data

(62) Division of application No. 09/458,819, filed on Dec. 13, 1999, now Pat. No. 6,368,980.

(30) Foreign Application Priority Data

Dec. 21, 1998 (JP) ............................................ 10-362716

(51) Int. Cl.⁷ ............................................... H01L 21/00
(52) U.S. Cl. ........................ 156/345; 257/797; 438/737
(58) Field of Search .......................... 438/8, 9, 14, 735, 438/737, 740, 743; 216/2, 41, 59, 79, 84; 430/5, 318, 313, 316, 323; 33/533, 613, 623, 645; 156/345 LC, 345 MT; 257/48, 797

(56) References Cited

U.S. PATENT DOCUMENTS

| 4,632,724 A | * 12/1986 | Chesebro et al. ............... 438/8 |
| 5,952,247 A | * 9/1999 | Livengood et al. ..... 438/735 X |
| 6,274,393 B1 | * 8/2001 | Hartswick ............... 438/719 X |

FOREIGN PATENT DOCUMENTS

| JP | 4-159706 | 6/1992 |
| JP | 8-17718 | 1/1996 |

* cited by examiner

*Primary Examiner*—William A. Powell
(74) *Attorney, Agent, or Firm*—Junichi Mimura

(57) ABSTRACT

A resist mark for measuring the accuracy of overlay of a photomask disposed on a semiconductor wafer, includes a first measurement mark having a first opening, formed on the substrate, an intermediate layer formed on the first measurement mark and in the first opening, a frame-shaped second measurement mark formed on the intermediate layer, and a third measurement mark that is spaced from the second measurement mark toward the outside, formed on the intermediate layer. The second measurement mark has a width which is short enough not to be influenced by a deformation caused by the thermal flow phenomenon.

14 Claims, 3 Drawing Sheets

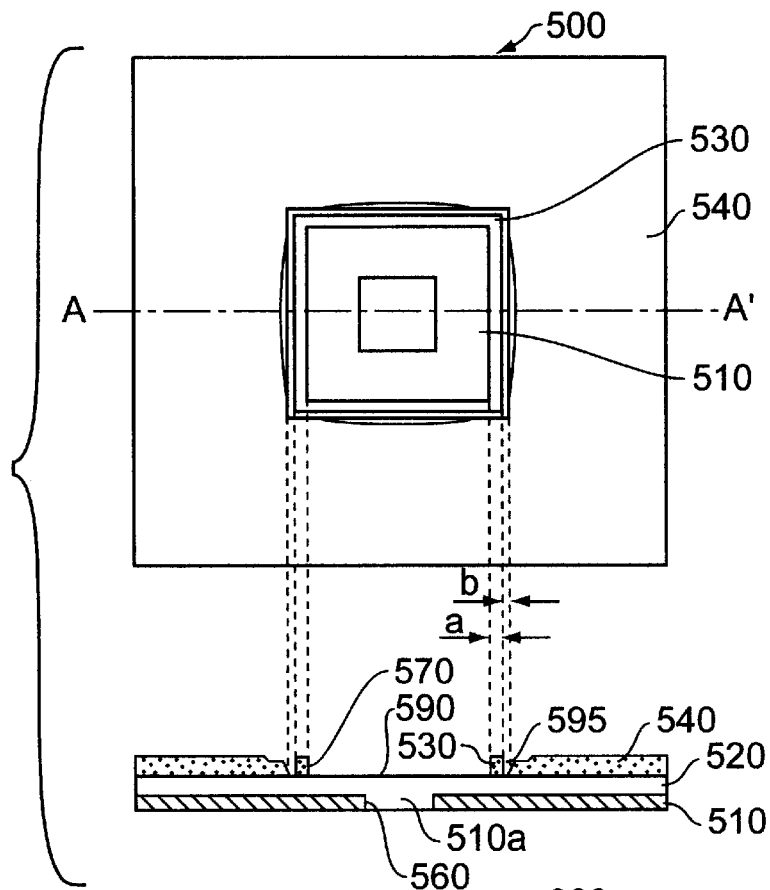
FIG. 2A
FIG. 2B
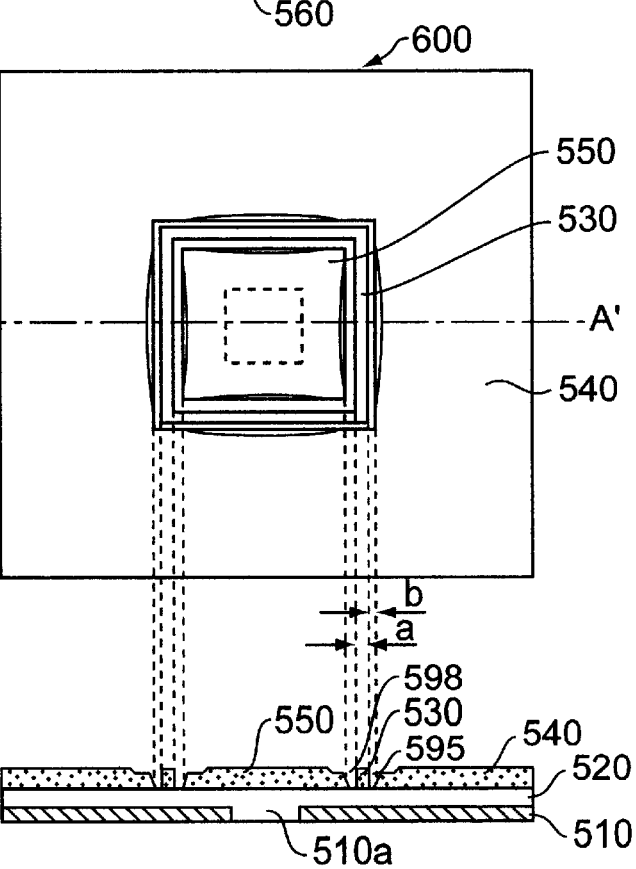
FIG. 3A
FIG. 3B

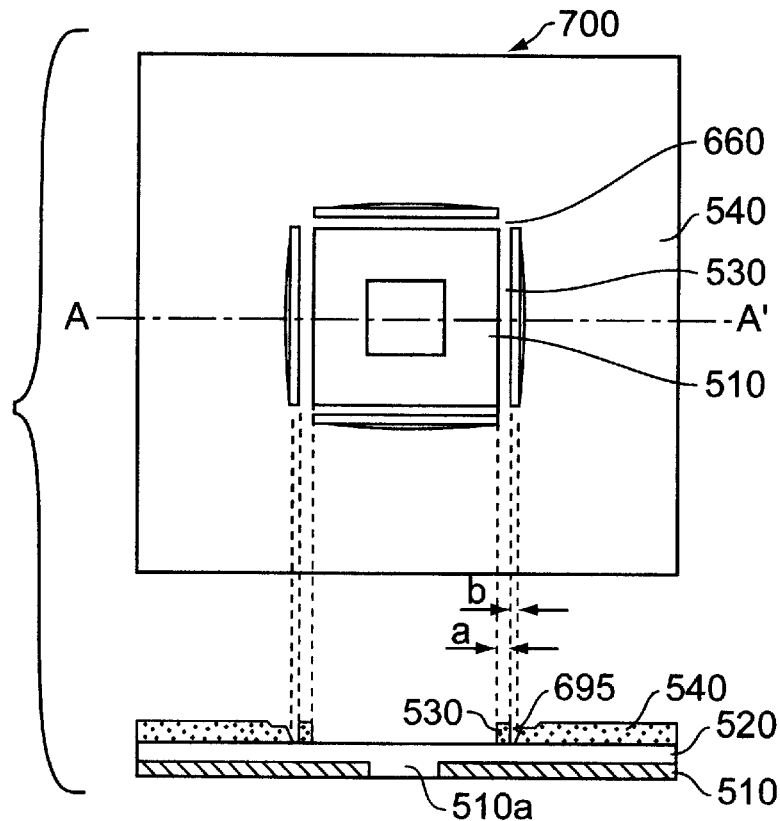
FIG. 4A
FIG. 4B
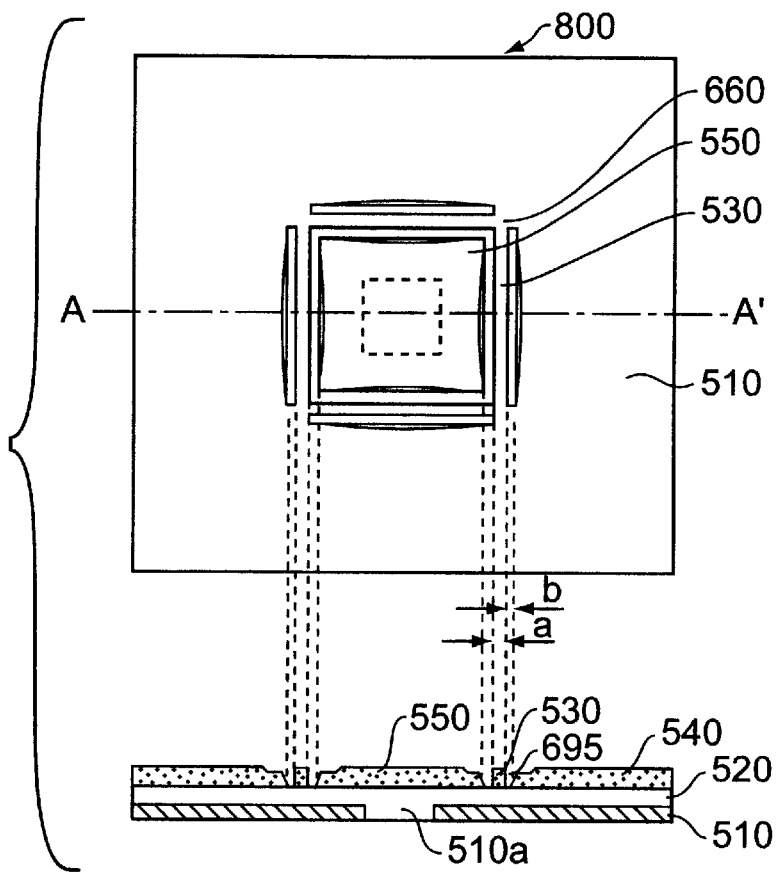
FIG. 5A
FIG. 5B

RESIST MASK HAVING MEASUREMENT MARKS FOR MEASURING THE ACCURACY OF OVERLAY OF A PHOTOMASK DISPOSED ON SEMICONDUCTOR WAFER

CROSS-REFERENCE TO RELATED APPLICATION

This application claims the priority benefit of Japanese Patent Application No. 10-362716, filed Dec. 21, 1998, the entire subject matter of which is incorporated herein by reference. This application is a division of Ser. No. 09/458,819, filed Dec. 13, 1999, now U.S. Pat. No. 6,368,980.

BACKGROUND OF THE INVENTION

1. Field of the Invention

The invention relates to a measurement mark for measuring the accuracy of overlay of a photomask disposed on a semiconductor wafer, and also to a method of forming the measurement mark formed on the semiconductor wafer.

2. Description of the Related Art

To form circuit patterns on a silicon substrate, a photomask on which the circuit patterns are drawn is disposed on the silicon substrate, and then the circuit patterns on the mask are transferred onto a resist film formed on the silicon substrate by using conventional lithograph technology. Then, the circuit patterns are formed using conventional etching, with the patterned resist film serving as an etching mask. This lithographic process requires the accurate alignment of the photomask and the silicon substrate. To perform an accurate alignment, an alignment pattern formed on the photomask is overlaid on an alignment mark that is formed on the silicon substrate.

The accuracy of the alignment is measured by a resist mark having several measurement marks. Referring to FIG. 1A, an alignment mark 1 are formed on an alignment mark area 10 and a first measurement mark 2 are formed on a measurement area 20 of the silicon substrate 3 using the first photomask 4. Then, a resist layer is formed on the entire surface of the silicon substrate 3. After that, referring to FIG. 1B, an insulating layer 9, such as silicon oxide layer is formed on the entire surface of the silicon substrate 3, and then, an resist film is formed on the insulating layer 9. After that, an alignment pattern 5 formed on a second photomask 6 is overlaid on the alignment mark 1 on the silicon substrate 3 by detecting an edge of the alignment mark 1, and then, a conventional lithographic process is performed. As a measurement pattern 7 is formed on the second photomask 6, a measurement mark 8 is formed by transferring the measurement pattern 7 into the resist film. As a distance between facing sides of the measurement pattern 7 is longer than a distance between facing sides of the first measurement mark 2, an edge 40 of the first measurement mark 2 is encompassed by an edge 30 of the second measurement mark 8. A value of the dislocation of the second photomask is measured by detecting the location of the edges 30, 40 of the first and second measurement mark 2, 8.

In the process for forming the second measurement mark 8, a thermal treatment is performed at over 100° C. for the second measurement mark 8 in order to reduce an organic solvent remained excessively in the second measurement mark 8 or to stiffen the second measurement mark 8 by a bridge-building reaction of macromolecules. In the performance of the thermal treatment, the second measurement mark 8 is deformed at its edge 30 by a phenomenon generally known as the "thermal flow". Specifically, the deformation of the second measurement mark 8 at its edge 30 occurs if the distance between the facing sides is long because a large stress is applied to the second measurement mark 8.

As the measurement of the dislocation using the deformed edge is not accurate, the alignment of another photomask in the subsequent process also is not accurate. As a result, a defective circuit will be manufactured.

SUMMARY OF THE INVENTION

An objective of the invention is to resolve the above-described problem and to provide a resist mark having measurement marks which are not affected by the thermal flow phenomenon and which improve the alignment accuracy.

Another objective of the invention is to provide a method for forming a resist mark having features described above.

To achieve these objectives, a resist mark for measuring the accuracy of overlay of a photomask disposed on a semiconductor wafer, includes a first measurement mark having a first opening, formed on the substrate, an intermediate layer formed on the first measurement mark and in the first opening, a frame-shaped second measurement mark formed on the intermediate layer, and a third measurement mark that is spaced from the second measurement mark toward the outside, formed on the intermediate layer. The second measurement mark has a width which is short enough not to be influenced by a deformation caused by the thermal flow phenomenon. Further, the resist mask further includes a fourth measurement mark formed in an area which is surrounded by the second measurement mark. Still further, the second measurement mark is connected to the third measurement mark at its corners.

These objectives are further achieved by a method for manufacturing a semiconductor wafer having a resist mark for measuring the accuracy of overlay of a photomask disposed on the semiconductor wafer, the method including (a) forming a first layer on the semiconductor wafer, (b) forming a first rectangularly shaped opening in the first layer to make a first measurement mark, (c) forming an intermediate layer on the first measurement mark and in the first opening, (d) forming a second layer on the intermediate layer, (e) forming a second measurement mark and a third measurement mark by forming a second rectangularly shaped opening and a frame-shaped opening in the second layer, the second rectangularly shape located above the first opening, the second measurement mark being isolated form the third measurement mark by the frame-shaped opening, (f) wherein the second measurement mark is formed in a frame shape, and (g) wherein the second measurement mark has a width which is short enough not to be influenced by a deformation caused by the thermal flow phenomenon.

BRIEF DESCRIPTION OF THE DRAWINGS

The invention will be more particularly described with reference to the accompanying drawings in which:

FIG. 2A is a plan view of a resist mark, according to a first embodiment of the invention;

FIG. 2B is a sectional view taken along line A–A' shown in FIG. 2A;

FIG. 3A is a plan view of a resist mark, according to a first alternative embodiment of the invention;

FIG. 3B is a sectional view taken along line A–A' shown in FIG. 3A;

FIG. 4A is a plan view of a resist mark, according to a second alternative embodiment of the invention;

FIG. 4B is a sectional view taken along line A–A' shown in FIG. 4A;

FIG. 5A is a plan view of a resist mark, according to a third alternative embodiment of the invention; and FIG. 5B is a sectional view taken along line A–A' shown in FIG. 5A.

DETAILED DESCRIPTION OF THE PREFERRED EMBODIMENTS

Figure 1A:
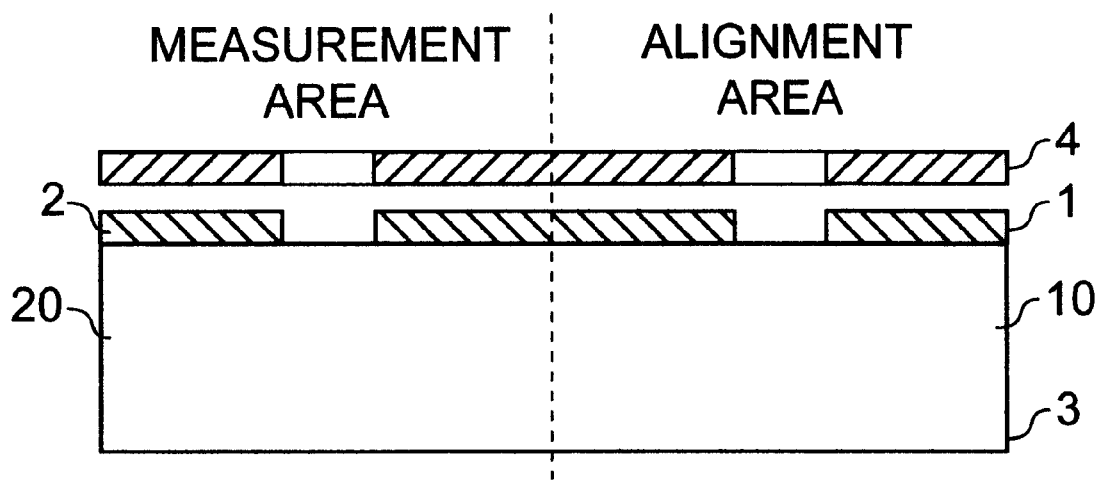
FIGS. 1A and 1B are sequential sectional views for forming an alignment mark and measurement marks.
Figure 1B:
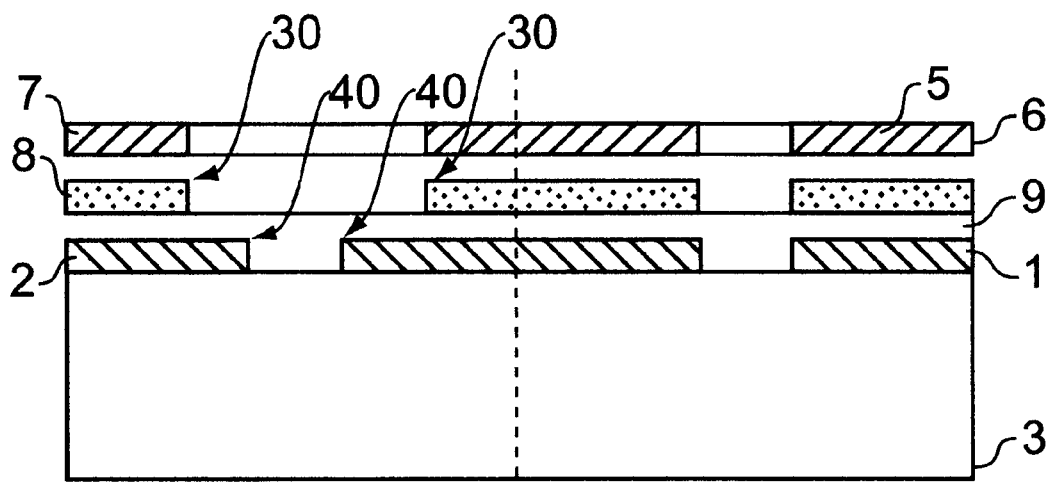

A resist mark 500 having several measurement marks for measuring the accuracy of overlay of a photomask is shown in FIGS. 2A and 2B. The resist mark 500 is formed by the process described below.

First, a polysilicon layer having a thickness of 2000 Å is formed on a silicon substrate by CVD, and then, a first measurement mark 510 is formed by a conventional lithographic process using a first photomask to expose the surface of the silicon substrate with a first opening 510a. Next, an intermediate layer 520 having a thickness of 5000 Å–1000 Å which is formed of an insulating material such as silicon oxide, is formed on the exposed surface of the silicon substrate and on the first measurement mark 510 by CVD. Then, a 5000 Å–30000 Å thick resist film is formed by a spin coating process on the entire surface of the intermediate layer 520, and then, a second measurement mark 530, a third measurement mark 540, a second opening 590 and a first frame-shaped third opening 595, are formed simultaneously by a conventional lithographic process, using a second photomask. Both the second and the third measurement mark 530, 540 are frame-shaped, and the second measurement mark 530 is encompassed by the third measurement mark 540. The second opening 590 is encompassed by the second measurement mark 530, which has a width of 0.3 to 10.0 μm. The second measurement mark 530 is isolated completely from the third measurement mark 540, which has a width of 20.0 to 30.0 μm, by the third opening 595, which has a width of around 0.3 to 10.0 μm. A value of the dislocation of the second photomask is measured by detecting the location of the edges 560, 570 respectively of the first and second measurement mark 510, 530. As the width of the second measurement mark 530 is short enough in this embodiment, no deformation is caused by the thermal flow phenomenon at the edge 570 of the second measurement mark 530, because no stress is applied to the second measurement mark 530.

According to the first embodiment of the invention, the dislocation of the second photomask can be measured accurately using the second measurement pattern 530, which has the fine edge. Furthermore, as the intermediate layer 520 is covered by the third measurement mark 540, unnecessary etching of the intermediate layer 520 in the subsequent etching process, can be avoided.

Referring to FIGS. 3A and 3B, the first alternative resist mark is illustrated. The only difference between the first and alternative embodiments of the resist mark is that in the first alternative, the fourth measurement pattern 550 is formed on the intermediate layer 520 in the second opening 530. The fourth measurement pattern 550 is isolated from the second measurement pattern by a fourth frame-shaped opening 598 having 0.3–10.0 μm width. As the fourth measurement pattern 550 is formed with lithography, it is can be formed with the second and the third measurement mark simultaneously.

According to the first alternative resist mark, in addition to the benefit of the first embodiment, as the intermediate layer 520 in the first opening 590 is further covered by the fourth measurement mark 550, unnecessary etching of the intermediate layer 520 in the first opening 590 in the subsequent etching process can be avoided.

Referring to FIGS. 4A and 4B, the second alternative resist mark is illustrated. The only difference between the first resist mark and the second alternative resist mark is that in the second alternative, the second measurement mark 530 is connected to the third measurement mark 540 at each corner 660. Therefore, the third opening 595 of the first embodiment and the first alternative embodiment, is divided into four rectangularly shaped openings 695 in this second alternative embodiment. The four openings 695 are formed along by each side of the second measurement mark 530. The length of each of four openings 695, which are located between the second measurement mark 530 and third measurement mark 540, is substantially the same as the length of the second opening 590, that is 15–35 μm.

According to the second alternative resist mark, in addition to obtaining the benefit of the first embodiment, as the second measurement mark 530 is connected to the third measurement mark 540, the second measurement mark 530 is supported by the third measurement mark 540. That is, a suitable second measurement mark 530 can be formed even if the width of second measurement mark 530 is short.

Referring to FIGS. 5A and 5B, the third alternative resist mark is illustrated. The only difference between the second alternative resist mark and the third alternative resist mark is that the fourth measurement mark 550 described in the first alternative resist mark is also formed in the third alternative resist mark.

According to the third alternative resist mark, all benefits described above with respect to the resist mark of the first embodiment, the first alternative resist mark and the second alternative resist mark, can be obtained.

While the invention has been described with reference to illustrative embodiments, this description is not intended to be construed in a limiting sense. Various modifications of the illustrated embodiments, as well as other embodiments of the invention, will be apparent to those skilled in the art on reference to this description. Therefore, the appended claims are intended cover any such modifications or embodiments as fall within the true scope of the invention.

We claim:

1. A resist mark for measuring the accuracy of overlay of a photomask disposed on a semiconductor wafer, comprising:

a first measurement mark having a first opening, formed on the substrate;

an intermediate layer formed on the first measurement mark and in the first opening;

a frame-shaped second measurement mark formed on the intermediate layer; and a third measurement mark that is spaced from the second measurement mark toward the outside, formed on the intermediate layer.

2. A resist mark as claimed in claim 1, wherein the second measurement mark has a width in the range of 0.3–1.0 μm.

3. A resist mark as claimed in claim 1, wherein a distance between the second measurement mark and the third measurement mark is in the range of 0.3–1.0 μm.

4. A resist mark as claimed in claim 1, further comprising a fourth measurement mark formed in an area surrounded by the second measurement mark, the fourth measurement mark being spaced from the second measurement mark.

5. A resist mark as claimed in claim 4, wherein the second measurement mark has a width in the range of 0.3–1.0 μm.

6. A resist mark as claimed in claim 1, wherein a distance between the second measurement mark and the third measurement mark is in the range of 0.3–1.0 μm.

7. A resist mark as claimed in claim 1, wherein the second measurement mark is connected to the third measurement mark at the corners of the second measurement mark.

8. A resist mark as claimed in claim 7, wherein the second measurement mark has a width in the range of 0.3–1.0 μm.

9. A resist mark as claimed in claim 7, wherein a distance between the second measurement mark and the third measurement mark is in the range of 0.3–1.0 μm.

10. A resist mark as claimed in claim 7, further comprising a fourth measurement mark formed in an area surrounded by the second measurement mark, the fourth measurement mark being spaced from the second measurement mark.

11. A resist mark as claimed in claim 10, wherein the second measurement mark has a width in the range of 0.3–1.0 μm.

12. A resist mark as claimed in claim 7, wherein a distance between the second measurement mark and the third measurement mark is in the range of 0.3–1.0 μm.

13. A resist mark as claimed in claim 7, wherein the second measurement mark surrounds an area, and the area having a side, and wherein the space isolates the second measurement mark from the third measurement mark, the space having a length substantially the same as the length of the side of the area surrounded by the second measurement mark.

14. A resist mark as claimed in claim 1, wherein the second measurement mark has a width which is short enough not to be influenced by a deformation caused by the thermal flow phenomenon.

* * * * *